United States Patent [19]

Tomita

[11] Patent Number: 5,751,652
[45] Date of Patent: May 12, 1998

[54] SEMICONDUCTOR APPARATUS HAVING A VOLTAGE UNIT AND A BACKUP UNIT FOR PROVIDING A REDUCED POWER CONSUMPTION

[75] Inventor: Hiroyoshi Tomita, Kawasaki, Japan

[73] Assignee: Fujitsu Limited, Kanagawa, Japan

[21] Appl. No.: 867,044

[22] Filed: Jun. 2, 1997

[30] Foreign Application Priority Data

Dec. 13, 1996 [JP] Japan .................................. 8-333528

[51] Int. Cl.$^6$ ............................................. G11C 13/00
[52] U.S. Cl. ................ 365/226; 365/148; 365/189.09; 365/189.11
[58] Field of Search ........................ 365/226, 189.09, 365/149, 189.11

[56] References Cited

U.S. PATENT DOCUMENTS 5,453,956  9/1995  Iwase et al. ........................ 365/226
5,566,386  10/1996 Kunakura et al. ................... 365/226
5,673,232  9/1997  Furutami et al. .................... 365/226

Primary Examiner—Do Hyun Yoo
Attorney, Agent, or Firm—Nikaido, Marmelstein, Murray & Oram LLP

[57] ABSTRACT

A semiconductor apparatus includes a voltage unit which supplies a down voltage produced at a node, the voltage unit having a plurality of resistors connected in series between a power supply line and a grounding line, the node being a connection point between the plurality of resistors. A backup unit pulls up the node of the voltage unit when a voltage at the node is below a lower limit of the down voltage, so that the voltage at the node increases to the lower limit, and pulls down the node of the voltage unit when the voltage at the node is above an upper limit of the down voltage, so that the voltage at the node decreases to the upper limit. A control unit sets the backup unit in one of an active state and an inactive state in response to a control signal.

10 Claims, 10 Drawing Sheets ns, in order to provide adequate capabilities of charging and discharging for withstanding the load during the power-up of the SDRAM. However, it is difficult for the above-mentioned SDRAM to effectively reduce the power consumption of such backup units since they must have great charging/discharging capabilities adequate for withstanding the load during the power-up condition.

SEMICONDUCTOR APPARATUS HAVING A VOLTAGE UNIT AND A BACKUP UNIT FOR PROVIDING A REDUCED POWER CONSUMPTION

BACKGROUND OF THE INVENTION (1) Field of the Invention

The present invention relates to a semiconductor apparatus which includes a voltage unit for supplying a down voltage produced at a node from a supply voltage, and a backup unit for maintaining the down voltage of the voltage unit. The semiconductor apparatus of the present invention may include a reference voltage unit for supplying an internally produced reference voltage to an internal unit of the apparatus when an externally produced reference voltage is not supplied to a reference-voltage terminal, and for supplying the externally produced reference voltage to the internal unit when it is supplied to the reference-voltage terminal.

(2) Description of the Related Art

A semiconductor apparatus, such as a synchronous dynamic random access memory (SDRAM), which utilizes an external supply voltage VCC is known. Hereinafter, the synchronous dynamic random access memory will be referred to as the SDRAM. The supply voltage VCC is equal to, for example, 3.3 volts.

Generally, the SDRAM may include a first voltage down converter which produces a first voltage VPR from the supply voltage VCC, and a second voltage down converter which produces a second voltage VDP from the supply voltage VCC. The first voltage VPR is equal to, for example, VCC/2, or half as much as the supply voltage VCC, (for example, VPR=1.65 volts). The second voltage VDP is lower than the VCC/2 and equal to, for example, 1.0 volts (VDP=1.0 volts<VCC/2).

For example, in the above-mentioned SDRAM, the first voltage VPR from the first voltage down converter, which is equal to VCC/2, is supplied to pre-charge a bit line for outputting data of a cell and to pre-charge a cell plate. The second voltage VDP from the second voltage down converter, which is lower than VCC/2, is supplied to pre-charge a data bus connected to an output buffer for outputting data to an external terminal.

In the above-mentioned SDRAM, capabilities of charging and discharging of the first and second voltage down converters for withstanding the load are preset based on a power-down condition of the SDRAM during power-down of the supply voltage. During the power-down of the supply voltage, a voltage fluctuation due to the load on the first and second voltage down converters is negligible. For this reason, the capabilities of charging and discharging of these converters can be easily determined without taking into account the voltage fluctuation due to the load.

However, during power-up of the SDRAM, such as when the SDRAM is in an idle condition or an active condition, the voltage fluctuation due to the load becomes great. In the above-mentioned SDRAM, there may be provided backup units having a great capability of charging and discharging, in association with the first and second voltage down converters, in order to provide adequate capabilities of charging and discharging for withstanding the load during the power-up of the SDRAM. However, it is difficult for the above-mentioned SDRAM to effectively reduce the power consumption of such backup units since they must have great charging/discharging capabilities adequate for withstanding the load during the power-up condition.

Further, the SDRAM may include a reference voltage unit which supplies an internally produced reference voltage (=1.4 volts) to an internal unit when the SDRAM is used in an LVTTL system which utilizes the LVTTL (low voltage transistor transistor logic) as the data transmission method, and supplies an externally produced reference voltage (=1.4 volts) to the internal unit when the SDRAM is used in an SSTTL system which utilizes the SSTTL (stub series terminated transceiver logic) as the data transmission method. However, it is difficult for the above-mentioned SDRAM to effectively reduce the power consumption of the reference voltage unit.

There is a demand for reduction of the power consumption of the SDRAM, and it is desirable to provide a semiconductor apparatus including a backup unit and/or a reference voltage unit which efficiently consumes power and minimizes waste of power.

SUMMARY OF THE INVENTION

A general object of the present invention is to provide an improved semiconductor apparatus in which the above-described problems are eliminated.

Another, more specific object of the present invention is to provide a semiconductor apparatus including a voltage unit and a backup unit which efficiently consumes power and minimizes waste of power in order to provide a reduction of the power consumption.

Still another object of the present invention is to provide a semiconductor apparatus including a reference voltage unit which efficiently consumes power and minimizes waste of power in order to provide a reduction of the power consumption.

The above-mentioned objects of the present invention are achieved by a semiconductor apparatus which comprises: a voltage unit which supplies a down voltage produced at a node from a supply voltage, the voltage unit having a plurality of resistors connected in series between a power supply line and a grounding line, the node being a connection point between the plurality of resistors; a backup unit which pulls up the node of the voltage unit when a voltage at the node is below a lower limit of the down voltage, so that the voltage at the node increases to the lower limit, and pulls down the node of the voltage unit when the voltage at the node is above an upper limit of the down voltage, so that the voltage at the node decreases to the upper limit; and a control unit which sets the backup unit in an active state during a period for which a load exceeds a capability of charging and discharging of the voltage unit, and sets the backup unit in an inactive state when the load does not exceed the capability of charging and discharging of the voltage unit.

According to the semiconductor apparatus of the present invention, the backup unit, provided in association with the voltage unit, can efficiently consume power. It is possible for the semiconductor apparatus of the present invention to provide a reduction of the power consumption. Further, according to the semiconductor apparatus of the present invention, the reference voltage unit can efficiently consume power. It is possible for the semiconductor apparatus of the present invention to provide a reduction of the power consumption.

BRIEF DESCRIPTION OF THE DRAWINGS

The above and other objects, features and advantages of the present invention will be more apparent from the following detailed description when read in conjunction with the accompanying drawings in which.

DESCRIPTION OF THE PREFERRED EMBODIMENTS

A description will now be given of the preferred embodiments of the present invention with reference to the accompanying drawings.

Figure 1:
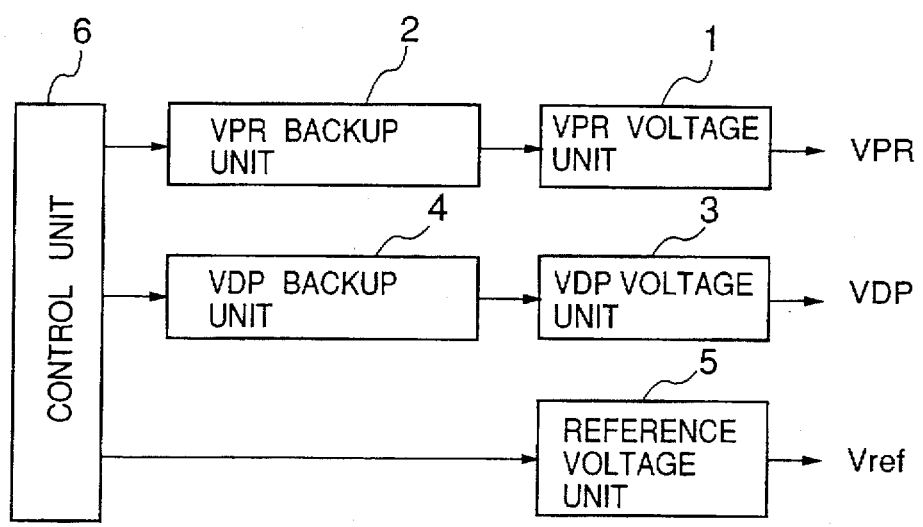
FIG. 1 is a block diagram showing main elements of a SDRAM embodying the present invention.

FIG. 1 shows main elements of a SDRAM (synchronous dynamic random access memory) embodying the present invention. As shown in FIG. 1, the SDRAM of this embodiment generally has a VPR voltage unit 1, a VPR backup unit 2, a VDP voltage unit 3, a VDP backup unit 4, a reference voltage unit 5, and a control unit 6. Other elements of the SDRAM are the same as those known in the prior art.

Figure 2:
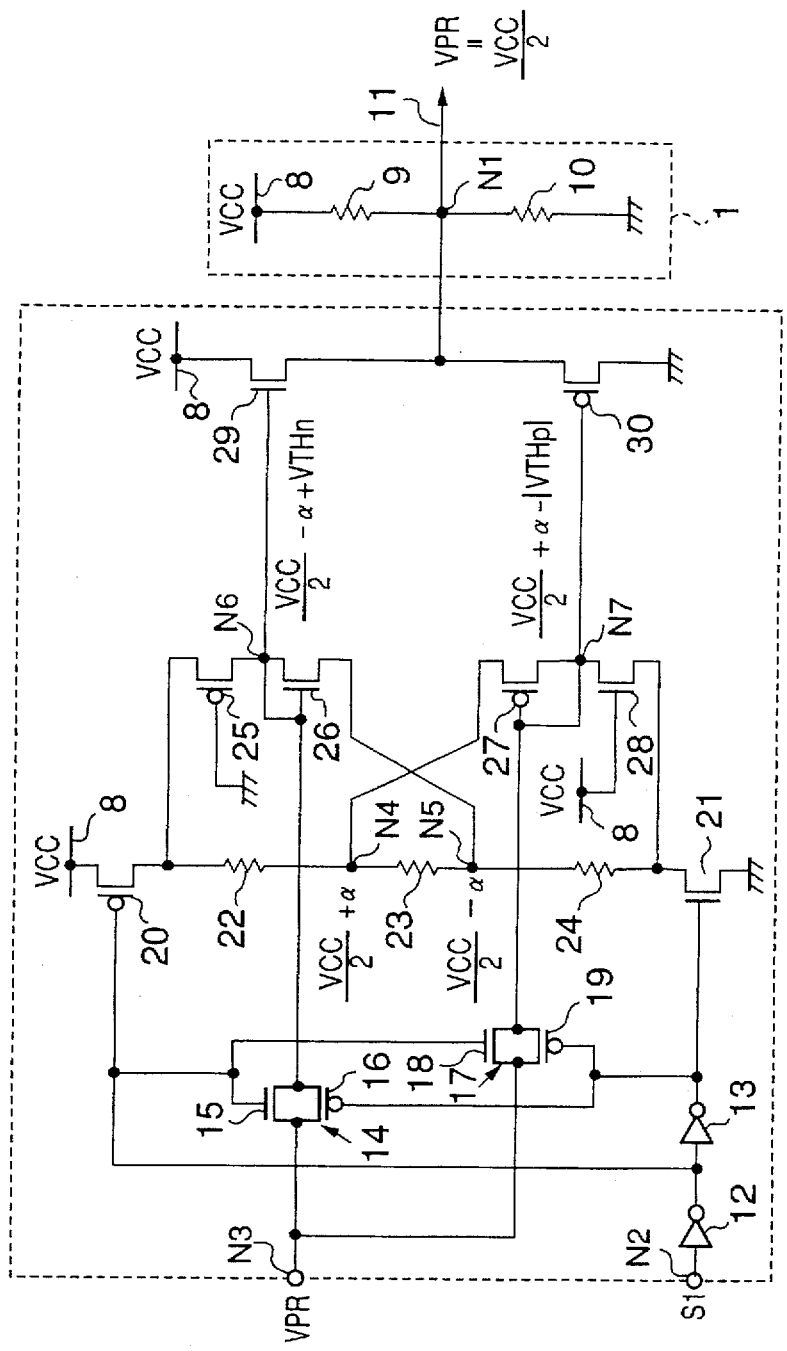
FIG. 2 is a circuit diagram of a VPR voltage unit and a VPR backup unit in the SDRAM of FIG. 1.

FIG. 2 shows the VPR voltage unit 1 and the VPR backup unit 2 in the SDRAM of FIG. 1. As shown in FIG. 2, the VPR voltage unit 1 generates a first voltage VPR obtained from an external supply voltage VCC. The first voltage VPR is set at half as much as the supply voltage VCC (VPR= VCC/2).

In the VPR voltage unit 1, a VCC power supply line 8 supplies the supply voltage VCC. The supply voltage VCC is equal to, for example, 3.3 volts. A resistor 9 and a resistor 10 are connected in series between the VCC power supply line 8 and a grounding line. The resistors 9 and 10 have high resistances which are equal to, for example, 530 kilo-ohms.

In the VPR voltage unit 1 of FIG. 2, a node N1 is a connection point between the resistor 9 and the resistor 10. The voltage VPR (VPR=VCC/2) at the node N1 of the VPR voltage unit 1 is supplied to the VPR backup unit 2 through a wire 11. The wire 11 is connected through the node N1 to a cell plate and a bit line. The voltage VPR from the VPR voltage unit 1 is supplied through the wire 11 to pre-charge the cell plate and the bit line.

The VPR backup unit 2 is provided in association with the VPR voltage unit 1. The VPR backup unit 2 performs charging and discharging of the node N1 of the VPR voltage unit 1 so that the voltage VPR at the node N1 of the VPR voltage unit 1 is maintained to be in a range of voltages of $VCC/2 \pm \alpha$ where $\alpha$ is a tolerance. The tolerance $\alpha$ is equal to, for example, 0.1 volts.

In the VPR backup unit 2 of FIG. 2, a node N2 is an input of the VPR backup unit 2 to which a control signal S1 from the control unit 6 is supplied. An inverter 12 inverts the control signal S1 from the control unit 6. An inverter 13 inverts the output of the inverter 12.

The control signal S1 in the present embodiment is set at the high level during a period from a time of power-up of the supply voltage VCC to a time of generation of a mode register set command writing signal MRSP or when a clock enable signal CKE is set at the high level. The mode register set command writing signal MRSP is generated to write the contents of a mode register set command to a mode register. The mode register set command describes the settings of a burst length and a CAS (column address strobe) latency. The clock enable signal CKE is set at the high level when an external clock signal CLK is set in the active state.

Further, the control signal S1 in the present embodiment is set at the low level when the clock enable signal CKE is set at the low level, except the period from the time of power-up of the supply voltage VCC to the time of generation of the mode register set command writing signal MRSP.

Hereinafter, a condition in which the signal MRSP is set at the high level is called an MRSP-ON condition in which the signal MRSP is generated, and a condition in which the signal MRSP is set at the low level is called an MRSP-OFF condition in which the signal MRSP is not generated.

In the VPR backup unit 2 of FIG. 2, a node N3 is an input of the VPR voltage unit 2 to which the first voltage VPR from the VPR voltage unit 1 is supplied. An analog switch 14 includes an n-channel MOSFET (metal oxide semiconductor field effect transistor) 15 and a p-channel MOSFET 16. Each of the n-channel MOSFET 15 and the p-channel MOSFET 16 has a source connected to the node N3. The n-channel MOSFET 15 has a gate connected to the output of the inverter 12. The ON/OFF state of the n-channel MOSFET 15 is controlled by the output of the inverter 12. The p-channel MOSFET 16 has a gate connected to the output of the inverter 13. The ON/OFF state of the p-channel MOSFET 16 is controlled by the output of the inverter 13.

An analog switch 17 includes an n-channel MOSFET 18 and a p-channel MOSFET 19. Each of the n-channel MOSFET 18 and the p-channel MOSFET 19 has a source connected to the node N3. The n-channel MOSFET 18 has a gate connected to the output of the inverter 12. The ON/OFF state of the n-channel MOSFET 18 is controlled by the output of the inverter 12. The p-channel MOSFET 19 has a gate connected to the output of the inverter 13. The ON/OFF state of the p-channel MOSFET 19 is controlled by the output of the inverter 13.

When the control signal S1 is set at the high level (that is, when the output of the inverter 12 is set at the low level and the output of the inverter 13 is set at the high level), the analog switches 14 and 17 are set in an OFF state.

When the control signal S1 is set at the low level (that is, when the output of the inverter 12 is set at the high level and the output of the inverter 13 is set at the low level), the analog switches 14 and 17 are set in an ON state.

A p-channel MOSFET 20 has a source connected to the VCC power supply line 8, and a gate connected to the output of the inverter 12. The p-channel MOSFET 20 serves as a switch. The ON/OFF state of the p-channel MOSFET 20 is controlled by the output of the inverter 12.

When the control signal S1 is set at the high level (that is, when the output of the inverter 12 is set at the low level), the p-channel MOSFET 20 is set in an ON state. When the control signal S1 is set at the low level (that is, when the output of the inverter 12 is set at the high level), the p-channel MOSFET 20 is set in an OFF state.

An n-channel MOSFET 21 has a source connected to the grounding line, and a gate connected to the output of the inverter 13. The n-channel MOSFET 21 serves as a switch. The ON/OFF state of the n-channel MOSFET 21 is controlled by the output of the inverter 13.

When the control signal S1 is set at the high level (that is, when the output of the inverter 13 is set at the high level), the n-channel MOSFET 21 is set in an ON state. When the control signal S1 is set at the low level (that is, when the output of the inverter 13 is set at the low level), the n-channel MOSFET 21 is set in an OFF state.

Three resistors 22, 23 and 24 are connected in series between a drain of the p-channel MOSFET 20 and a drain of the n-channel MOSFET 21. A node N4 is a connection point between the resistor 22 and the resistor 23. A node N5 is a connection point between the resistor 23 and the resistor 24.

The resistors 22, 23 and 24 have appropriate resistances such that, when the p-channel MOSFET 20 is set in an ON state and the n-channel MOSFET 21 is set in an ON state, the voltage at the node N4 is set at an upper limit of the first voltage VPR which is equal to (VCC/2+α) (volts), and the voltage at the node N5 is set at a lower limit of the first voltage VPR which is equal to (VCC/2−α) (volts).

A p-channel MOSFET 25 has a source connected to the drain of the p-channel MOSFET 20 and a gate connected to the grounding line. The p-channel MOSFET 25 serves as a resistor.

An n-channel MOSFET 26 has a source connected to the node N5 (the connection point between the resistor 23 and the resistor 24), a drain connected to a drain of the p-channel MOSFET 25, and a gate connected to the drain of the p-channel MOSFET 25. The n-channel MOSFET 26 serves as a diode.

A p-channel MOSFET 27 has a source connected to the node N4, and a gate connected to the drain of each of the n-channel MOSFET 18 and the p-channel MOSFET 19. The p-channel MOSFET 27 serves as a diode.

An n-channel MOSFET 28 has a source connected to the drain of the n-channel MOSFET 21, a gate connected to the VCC power supply line 8, and a drain connected to a drain of the p-channel MOSFET 27. The n-channel MOSFET 28 serves as a resistor.

An n-channel MOSFET 29 has a source connected to the node N1 of the VPR voltage unit 1, a drain connected to the VCC power supply line 8, and a gate connected to a node N6. The node N6 is a connection point between the drain of the p-channel MOSFET 25 and the drain of the n-channel MOSFET 26. The n-channel MOSFET 29 serves as a pull-up element for the node N1 of the VPR voltage unit 1.

A p-channel MOSFET 30 has a source connected to the node N1 of the VPR voltage unit 1, a drain connected to grounding line, and a gate connected to a node N7. The node N7 is a connection point between the drain of the p-channel MOSFET 27 and the drain of the n-channel MOSFET 28. The p-channel MOSFET 30 serves as a pull-down element for the node N1 of the VPR voltage unit 1.

In the VPR backup unit 2 of the above-described embodiment, the n-channel MOSFET 29 and the p-channel MOSFET 30 constitute a pull-up/pull-down unit. The inverters 12 and 13, the analog switches 14 and 17, the p-channel MOSFETs 20, 25 and 27, the n-channel MOSFETs 21, 26 and 28, and the resistors 22, 23 and 24 constitute a pull-up/pull-down control unit which controls the n-channel MOSFET 29 and the p-channel MOSFET 30.

In the VPR backup unit 2 of the above-described embodiment, when the control signal S1 is set at the high level (that is, during the period from the time of power-up of the supply voltage VCC to the time of generation of the signal MRSP or when the signal CKE is set at the high level): the output of the inverter 12 is set at the low level; the output of the inverter 13 is set at the high level; the analog switches 14 and 17 are set in an OFF state; and the p-channel MOSFET 20 and the n-channel MOSFET 21 are set in an ON state.

At this time, the voltage at the node N6 is set at a sum of the lower limit of the first voltage VPR and a threshold voltage VTHn of the n-channel MOSFET 26; that is, the voltage at the node N6 being equal to (VCC/2−α+VTHn) (volts). Also, the voltage at the node N7 at this time is set at a difference between the upper limit of the first voltage VPR and the absolute value of a threshold voltage VTHp of the p-channel MOSFET 27; that is, the voltage at the node N7 being equal to (VCC/2+α−|VTHp|) (volts).

When the first voltage VPR at the node N1 of the VPR voltage unit 1 is higher than the lower limit (VCC/2−α) and lower than the upper limit (VCC/2+α), the difference between the gate voltage of the n-channel MOSFET 29 and the source voltage of the n-channel MOSFET 29 is equal to (VTHn−α), and the difference is lower than the threshold voltage VTHn. Therefore, when (VCC/2−α)<VPR<(VCC/2+α), the n-channel MOSFET 29 is set in an OFF state. Further, the difference between the gate voltage of the p-channel MOSFET 30 and the source voltage of the p-channel MOSFET 30 at this time is equal to (α−|VTHp|), and the difference is higher than the threshold voltage (−|VTHp|). Therefore, when (VCC/2−α)<VPR<(VCC/2+α), the p-channel MOSFET 30 is set in an OFF state.

When the first voltage VPR at the node N1 of the VPR voltage unit 1 is lower than the lower limit (VCC/2−α), the difference between the gate voltage of the n-channel MOSFET 29 and the source voltage of the n-channel MOSFET 29 is above the threshold voltage VTHn. Therefore, when VPR≦(VCC/2−α), the n-channel MOSFET 29 is set in an ON state. Further, at this time, the difference between the gate voltage of the p-channel MOSFET 30 and the source voltage of the p-channel MOSFET 30 is above (2α−|VTHp|). Therefore, when VPR≦(VCC/2−α), the p-channel MOSFET 30 is set in an OFF state.

Accordingly, when VPR<(VCC/2−α), the n-channel MOSFET 29 pulls up the node N1 of the VPR voltage unit 1 to the voltage of (VCC/2−α). Current from the VCC power supply line 8 is fed into the node N1 of the VPR voltage unit 1 through the n-channel MOSFET 29, and the first voltage VPR at the node N1 of the VPR voltage unit 1 is increased to the voltage of (VCC/2−α). When VPR=(VCC/2−α), the n-channel MOSFET 29 finishes the pull-up operation for the node N1 of the VPR voltage unit 1. Further, when VPR>(VCC/2−α), the n-channel MOSFET 29 is set in an OFF state.

On the other hand, when VPR>(VCC/2+α), the difference between the gate voltage of the n-channel MOSFET 29 and the source voltage of the n-channel MOSFET 29 is below (−2α+VTHn). Therefore, when VPR≧(VCC/2+α), the n-channel MOSFET 29 is set in an OFF state. Further, at this time, the difference between the gate voltage of the p-channel MOSFET 30 and the supply source voltage of the p-channel MOSFET 30 is below (−|VTHp|). Therefore, when VPR≦(VCC/2+α), the p-channel MOSFET 30 is set in an ON state.

Accordingly, when VPR>(VCC/2+α), the p-channel MOSFET 30 pulls down the node N1 of the VPR voltage unit 1 to the voltage of (VCC/2+α). Current from the node N1 of the VPR voltage unit 1 is fed into the grounding line through the p-channel MOSFET 30, and the first voltage VPR at the node N1 of the VPR voltage unit 1 is decreased to the voltage of (VCC/2+α). When VPR=(VCC/2+α), the p-channel MOSFET 30 finishes the pull-down operation for the node N1 of the VPR voltage unit 1. Further, when VPR<(VCC/2+α), the p-channel MOSFET 30 is set in an OFF state.

As described above, when the control signal S1 is set at the high level (that is, during the period from the time of power-up of the supply voltage VCC to the time of generation of the signal MRSP or when the signal CKE is set at the high level), the VPR backup unit 2 is set in the active condition so that the first voltage VPR at the node N1 of the VPR voltage unit 1 is maintained to be in the range of voltages of VCC/2±α (volts).

Further, in the VPR backup unit 2 of the above-described embodiment, when the control signal S1 is set at the low level (that is, when the signal CKE is set at the low level, except the period from the time of power-up of the supply voltage VCC to the time of generation of the signal MRSP), the analog switches 14 and 17 are set in an ON state, the p-channel MOSFET 20 is set in an OFF state, and the n-channel MOSFET 21 is set in an OFF state.

At this time, the gate voltage of the n-channel MOSFET 29 is set at the first voltage VPR, and the gate voltage of the p-channel MOSFET 30 is set at the first voltage VPR. The n-channel MOSFET 29 being set in an OFF state and the p-channel MOSFET 30 being set in an OFF state are maintained, and the VPR backup unit 2 is set in the non-inactive condition.

Figure 3:
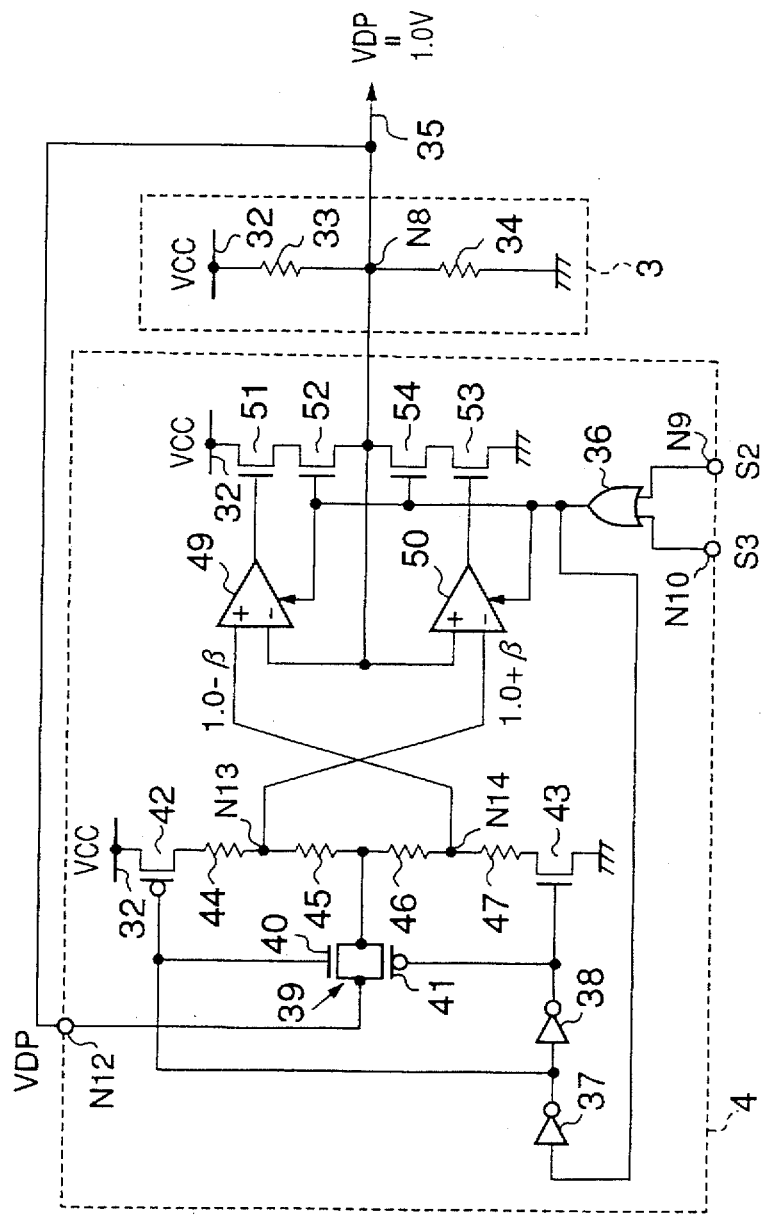
FIG. 3 is a circuit diagram of a VDP voltage unit and a VDP backup unit in the SDRAM of FIG. 1.

FIG. 3 shows the VDP voltage unit 3 and the VDP backup unit 4 in the SDRAM of FIG. 1. As shown in FIG. 3, the VDP voltage unit 3 generates a second voltage VDP obtained from the supply voltage VCC. The second voltage VDP is set at, for example, 1.0 volts (VDP=1.0 volts).

In the VDP voltage unit 3, a VCC power supply line 32 supplies the supply voltage VCC which is equal to the supply voltage VCC of the VCC power supply line 8 of the VPR voltage unit 1. A resistor 33 and a resistor 34 are connected in series between the VCC power supply line 33 and the grounding line. The resistors 33 and 34 have high resistances which are appropriate to generate the second voltage VDP from the supply voltage VCC.

In the VDP voltage unit 3 of FIG. 3, a node N8 is a connection point between the resistor 33 and the resistor 34. The second voltage VDP (VDP=1.0 volts) at the node N8 of the VDP voltage unit 3 is supplied to the VDP backup unit 4 through a wire 35. The wire 35 is connected through the node N8 to a data bus pre-charging unit. The second voltage VDP from the VDP voltage unit 3 is supplied through the wire 35 and the data bus pre-charging unit to pre-charge a data bus connected to an output buffer for outputting data to an external terminal.

The VDP backup unit 4 is provided in association with the VDP voltage unit 3. The VDP backup unit 4 performs charging and discharging of the node N8 of the VDP voltage unit 3 so that the voltage VDP at the node N8 of the VDP voltage unit 3 is maintained to be in a range of voltages of 1.0±β where β is a tolerance. The tolerance β is equal to, for example, 0.1 volts.

In the VDP backup unit 4 of FIG. 3, a node N9 is an input of the VDP backup unit 4 to which a control signal S2 from the control unit 6 is supplied, and a node N10 is an input of the VDP backup unit 4 to which a control signal S3 from the control unit 6 is supplied.

The control signal S2 in the present embodiment is set at the high level during the period from the time of power-up of the supply voltage VCC to the time of generation of the signal MRSP. Further, the control signal S2 is set at the low level after the signal MRSP is generated (that is, after the signal MRSP is set at the high level).

Further, the control signal S3 in the present embodiment is generated based on the clock enable signal CKE and a row address strobe signal "rasz". In the present embodiment, the row address strobe signal "rasz" is set at the high level when a word line is powered up, and the row address strobe signal "rasz" is set at the low level when the word line is not powered up.

The control signal S3 in the present embodiment is set at the high level when the clock enable signal CKE is set at the high level and the row address strobe signal "rasz" is set at the high level (that is, when the word line is powered up and the clock enable signal CKE is set at the high level). Also, the control signal S3 is set at the high level when the control unit 6 is in a clock-suspend mode. Otherwise the control signal S3 is set at the low level.

In the VDP backup unit 4 of FIG. 3, an OR circuit 36 performs an OR operation between the control signal S2 at the node N9 and the control signal S3 at the node N10. An inverter 37 inverts the output of the OR circuit 36. An inverter 38 inverts the output of the inverter 37.

A node N12 is an input of the VDP backup unit 4 to which the second voltage VDP from the VDP voltage unit 3 is supplied. An analog switch 39 includes an n-channel MOSFET 40 and a p-channel MOSFET 41. Each of the n-channel MOSFET 40 and the p-channel MOSFET 41 has a source connected to the node N12. The n-channel MOSFET 40 has a gate connected to the output of the inverter 37. The ON/OFF state of the n-channel MOSFET 40 is controlled by the output of the inverter 37. The p-channel MOSFET 41 has a gate connected to the output of the inverter 38. The ON/OFF state of the p-channel MOSFET 41 is controlled by the output of the inverter 38.

When at least one of the control signal S2 and the control signal S3 is set at the high level: the output of the OR circuit 36 is set at the high level; the output of the inverter 37 is set at the low level; and the output of the inverter 38 is set at the high level. At this time, the analog switch 39 is set in an OFF state.

When both the control signal S2 and the control signal S3 are set at the low level: the output of the OR circuit 36 is set at the low level; the output of the inverter 37 is set at the high level; and the output of the inverter 38 is set at the low level. At this time, the analog switch 39 is set in an ON state.

A p-channel MOSFET 42 has a source connected to the VCC power supply line 32, and a gate connected to the output of the inverter 37. The p-channel MOSFET 42 serves as a switch. The ON/OFF state of the p-channel MOSFET 42 is controlled by the output of the inverter 37.

When one of the control signal S2 and the control signal S3 is set at the high level (that is, when the output of the OR circuit 36 is set at the high level and the output of the inverter 37 is set at the low level), the p-channel MOSFET 42 is set in an ON state. When both the control signal S2 and the control signal S3 are set at the low level (that is, when the output of the OR circuit 36 is set at the low level and the output of the inverter 37 is set at the high level), the p-channel MOSFET 42 is set in an OFF state.

An n-channel MOSFET 43 has a source connected to the grounding line, and a gate connected to the output of the inverter 38. The n-channel MOSFET 43 serves as a switch. The ON/OFF state of the n-channel MOSFET 43 is controlled by the output of the inverter 38.

When one of the control signal S2 and the control signal S3 is set at the high level (that is, when the output of the OR circuit 36 is set at the high level and the output of the inverter 38 is set at the high level), the n-channel MOSFET 43 is set in an ON state. When both the control signal S2 and the control signal S3 are set at the low level (that is, when the output of the OR circuit 36 is set at the low level and the output of the inverter 38 is set at the low level), the n-channel MOSFET 43 is set in an OFF state.

Four resistors 44, 45, 46 and 47 are connected in series between a drain of the p-channel MOSFET 42 and a drain of the n-channel MOSFET 43. A node N13 is a connection point between the resistor 44 and the resistor 45. A node N14 is a connection point between the resistor 46 and the resistor 47.

The resistors 44, 45, 46 and 47 have appropriate resistances such that, when the p-channel MOSFET 42 is set in an ON state and the n-channel MOSFET 43 is set in an ON state, the voltage at the node N13 is set at the voltage of VDP+$\beta$(=(1.0+$\beta$) volts) and the voltage at the node N14 is set at the voltage of VDP−$\beta$(=(1.0−$\beta$) volts).

A differential amplifier 49 has a non-inverting input connected to the node N14 and an inverting input connected to the node N8 of the VDP voltage unit 3. The active/inactive state of the differential amplifier 49 is controlled by the output of the OR circuit 36.

When the output of the OR circuit 36 is set at the high level (that is, when one of the control signal S2 and the control signal S3 is set at the high level), the differential amplifier 49 is set in the active state. When the output of the OR circuit 36 is set at the low level (that is, when both the control signal S2 and the control signal S3 are set at the low level), the differential amplifier 49 is set in the inactive state.

In the differential amplifier 49, the output of the differential amplifier 49 is set at the high level when the voltage at the non-inverting input thereof (the voltage (1.0−$\beta$) at the node N14) is higher than the voltage at the inverting input thereof (the voltage VDP at the node N8). The output of the differential amplifier 49 is set at the low level when the voltage at the non-inverting input thereof (the voltage (1.0−$\beta$) at the node N14) is lower than the voltage at the inverting input thereof (the voltage VDP at the node N8).

A differential amplifier 50 has a non-inverting input connected to the node N8 of the VDP voltage unit 3 and an inverting input connected to the node N13. The active/inactive state of the differential amplifier 50 is controlled by the output of the OR circuit 36.

When the output of the OR circuit 36 is set at the high level (that is, when one of the control signal S2 and the control signal S3 is set at the high level), the differential amplifier 50 is set in the active state. When the output of the OR circuit 36 is set at the low level (that is, when both the control signal S2 and the control signal S3 are set at the low level), the differential amplifier 50 is set in the inactive state.

During the active state of the differential amplifier 50, the output of the differential amplifier 50 is set at the high level when the voltage at the non-inverting input thereof (the voltage VDP at the node N8) is higher than the voltage at the inverting input thereof (the voltage (1.0+$\beta$) at the node N13). That is, when VDP>(1.0+$\beta$), the output of the differential amplifier 50 is set at the high level. Further, the output of the differential amplifier 50 is set at the low level when the voltage at the non-inverting input thereof (the voltage VDP at the node N8) is lower than the voltage at the inverting input thereof (the voltage (1.0+$\beta$) at the node N13). That is, when VDP$\leq$(1.0+$\beta$), the output of the differential amplifier 50 is set at the low level.

An n-channel MOSFET 51 has a drain connected to the VCC power supply line 32, and a gate connected to the output of the differential amplifier 49. The n-channel MOSFET 51 serves as a pull-up element for the node N8 of the VDP voltage unit 3.

An n-channel MOSFET 52 has a source connected to the node N8 of the VDP voltage unit 3, a drain connected to a source of the n-channel MOSFET 51, and a gate connected to the output of the OR circuit 36. The ON/OFF state of the n-channel MOSFET 52 is controlled by the output of the OR circuit 36. The n-channel MOSFET 52 serves as a switch.

An n-channel MOSFET 53 has a source connected to the grounding line, and a gate connected to the output of the differential amplifier 50. The n-channel MOSFET 53 serves as a pull-down element for the node N8 of the VDP voltage unit 3.

An n-channel MOSFET 54 has a source connected to a drain of the n-channel MOSFET 54, a drain connected to the node N8 of the VDP voltage unit 3, and a gate connected to the output of the OR circuit 36. The ON/OFF state of the n-channel MOSFET 54 is controlled by the output of the OR circuit 36. The n-channel MOSFET 54 serves as a switch.

In the VDP backup unit 4 of the above-described embodiment, the n-channel MOSFETs 51, 52, 53 and 54 constitute a pull-up/pull-down unit. The OR circuit 36, the inverters 37 and 38, the analog switch 39, the p-channel MOSFET 42, the n-channel MOSFET 43, the resistors 44, 45, 46 and 47, and the differential amplifiers 49 and 50 constitute a pull-up/pull-down control unit which controls the n-channel MOSFET 51 and the n-channel MOSFET 53.

In the VDP backup unit 4 of the above-described embodiment, when at least one of the control signal S2 and the control signal S3 is set at the high level, the VDP backup unit 4 is set in the active state. More specifically, when the control signal S2 is set at the high level (that is, during the period from the time of power-up of the supply voltage VCC to the time of generation of the signal MRSP): the output of the OR circuit 36 is set at the high level; the output of the inverter 37 is set at the low level; the output of the inverter 38 is set at the high level; the analog switch 39 is set in an OFF state; and the p-channel MOSFET 42 and the n-channel MOSFET 43 are set in an ON state. Alternatively, when the control signal S3 is set at the high level (that is, when the clock enable signal CKE is set at the high level and the word line is powered up or when the control unit 6 is in the clock-suspend mode), the VDP backup unit 4 is set in the active state which is the same as mentioned above.

At this time, the voltage at the node N13 is set at (1.0+$\beta$) (volts), and the voltage at the node N14 is set at (1.0−$\beta$) (volts). The differential amplifier 49 is set in the active state, and the differential amplifier 50 is set in the active state. The n-channel MOSFET 52 is set in an ON state, and the n-channel MOSFET 54 is set in an ON state.

When the second voltage VDP at the node N8 of the VDP voltage unit 3 is higher than (1.0−$\beta$) and lower than (1.0+$\beta$), the output of the differential amplifier 49 is set at the low level, and the output of the differential amplifier 50 is set at the low level. The n-channel MOSFET 51 is set in an OFF state, and the n-channel MOSFET 53 is set in an OFF state.

When VDP$\leq$(1.0−$\beta$), the output of the differential amplifier 49 is set at the high level, and the n-channel MOSFET 51 is set in an ON state. The output of the differential amplifier 50 is set at the low level, and the n-channel MOSFET 53 is set in an OFF state.

At this time, the n-channel MOSFET 51 pulls up the node N8 of the VDP voltage unit 3 to the voltage of $(1.0-\beta)$. Current from the VCC power supply line 32 is fed into the node N8 of the VDP voltage unit 3 through the n-channel MOSFETs 51 and 52, and the second voltage VDP at the node N8 of the VDP voltage unit 3 is increased to the voltage of $(1.0-\beta)$. When VDP=$(1.0-\beta)$, the n-channel MOSFET 51 finishes the pull-up operation and it is set in an OFF state.

When VDP$\geq (1.0+\beta)$, the output of the differential amplifier 49 is set at the high level, and the n-channel MOSFET 51 is set in an OFF state. The output of the differential amplifier 50 is set at the high level, and the n-channel MOSFET 53 is set in an ON state.

At this time, the n-channel MOSFET 53 pulls down the node N8 of the VDP voltage unit 3 to the voltage of $(1.0+\beta)$. Current from the node N8 of the VDP voltage unit 3 is fed into the grounding line through the n-channel MOSFETs 53 and 54, and the second voltage VDP at the node N8 of the VDP voltage unit 3 is decreased to the voltage of $(1.0+\beta)$. When VDP=$(1.0+\beta)$, the n-channel MOSFET 53 finishes the pull-down operation and it is set in an OFF state.

Accordingly, when at least one of the control signal S2 and the control signal S3 is set at the high level (that is: during the period from the time of power-up of the supply voltage VCC to the time of generation of the signal MRSP; when the clock enable signal CKE is set at the high level and the word line is powered up; or when the control unit 6 is in the clock-suspend mode), the VDP backup unit 4 is set in the active state and the second voltage VDP at the node N8 of the VDP voltage unit 3 is maintained to be in the range of voltages of $1.0\pm\beta$ by the VDP backup unit 4.

On the other hand, when both the control signal S2 and the control signal S3 are set at the low level (that is, when the clock enable signal CKE is set at the low level, or when the clock enable signal CKE is set at the high level but the word line is not powered up, except during the period from the time of power-up of the supply voltage VCC to the time of generation of the signal MRSP, or when the control unit 6 is in the clock-suspend mode): the VDP backup unit 4 of the above-described embodiment is set in the inactive state.

At this time, the output of the OR circuit 36 is set at the low level, the output of the inverter 37 is set at the high level, the output of the inverter 38 is set at the low level, the analog switch 39 is set in an ON state, and the p-channel MOSFET 42 and the n-channel MOSFET 43 are set in an OFF state. The differential amplifier 49 is set in the inactive state, the differential amplifier 50 is set in an OFF state, the n-channel MOSFET 52 is set in an OFF state, and the n-channel MOSFET 54 is set in an OFF state.

Figure 4:
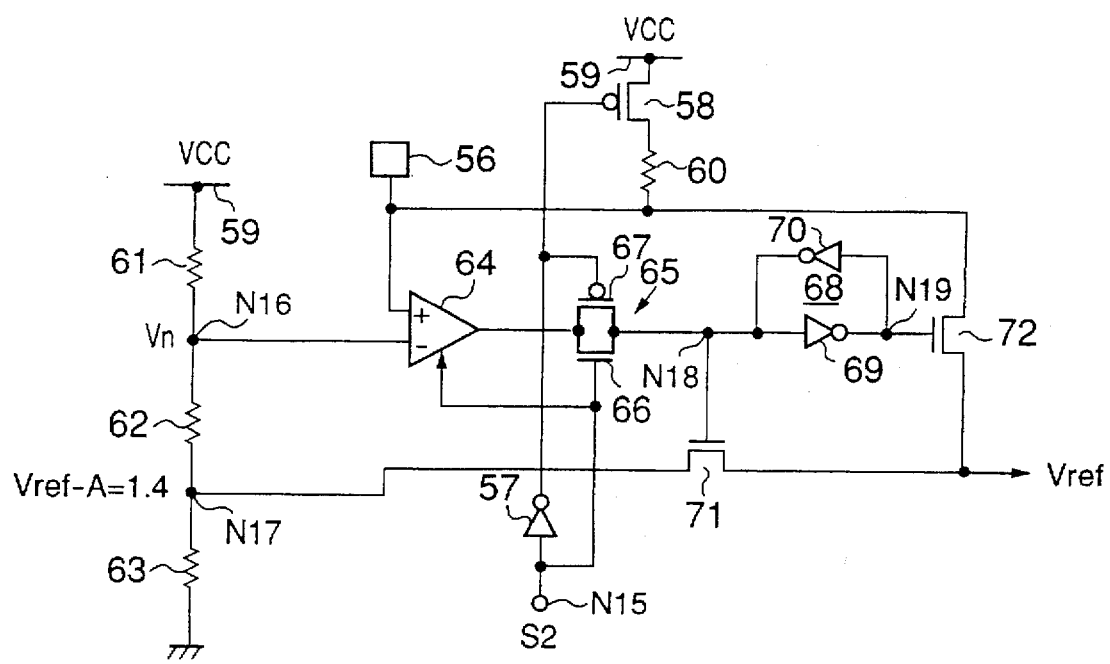
FIG. 4 is a circuit diagram of a reference voltage unit in the SDRAM of FIG. 1.

FIG. 4 shows the reference voltage unit 5 in the SDRAM of FIG. 1. As shown in FIG. 4, the reference voltage unit 5 supplies an internally produced reference voltage Vref-A to an internal unit (not shown) of the SDRAM through an output terminal of the reference voltage unit 5 when an externally produced reference voltage Vref-B is not supplied to a reference-voltage terminal, and supplies the reference voltage Vref-B to the internal unit through the output terminal when the reference voltage Vref-B is supplied to the reference-voltage terminal.

In the reference voltage unit 5 of FIG. 4, reference numeral 56 indicates an external reference-voltage terminal. When the SDRAM is used in the LVTTL system, the reference voltage Vref-B is not supplied to the reference-voltage terminal 56 and the reference-voltage terminal 56 is separated from the reference voltage unit 5. When the SDRAM is used in the SSTL system, the reference voltage Vref-B (=1.4 volts) is supplied to the reference-voltage terminal 56.

A node N15 is an input of the reference voltage unit 5 to which the control signal S2 from the control unit 6 is supplied. An inverter 57 inverts the control signal S2 supplied to the node N15. A p-channel MOSFET 58 has a source connected to a VCC power supply line 59, a drain connected to one end of a resistor 60, and a gate connected to the output of the inverter 57. The VCC power supply line 59 supplies the supply voltage VCC. The resistor 60 has a high resistance which is appropriate to detect whether the reference voltage Vref-B is supplied to the reference-voltage terminal 56.

Three resistors 61, 62 and 63 are connected in series between the VCC power supply line 59 and the grounding line. A node N16 is a connection point between the resistor 61 and the resistor 62. A node N17 is a connection point between the resistor 62 and the resistor 63. The resistors 61, 62 and 63 have appropriate resistances such that the voltage at the node N16 is set at an intermediate voltage Vn which is higher than 1.4 volts and lower than 3.3 volts, and the voltage at the node N17 is set at 1.4 volts. The internally produced reference voltage obtained at the node N17 is called the reference voltage Vref-A.

A differential amplifier 64 has a non-inverting input connected to the reference-voltage terminal 56 and the other end of the resistor 60, and an inverting input connected to the node N16. The active/inactive state of the differential amplifier 64 is controlled by the control signal S2 being sent from the node N15. When the control signal S2 is set at the high level, the differential amplifier 64 is set in the active state. When the control signal S2 is set at the low level, the differential amplifier 64 is set in the inactive state.

An analog switch 65 includes an n-channel MOSFET 66 and a p-channel MOSFET 67. The n-channel MOSFET 66 has a source connected to the output of the differential amplifier 64, and a gate connected to the node N15. The ON/OFF state of the n-channel MOSFET 66 is controlled by the control signal S2 being fed from the node N15. The p-channel MOSFET 67 has a source connected to the output of the differential amplifier 64, and a gate connected to the output of the inverter 57. The ON/OFF state of the p-channel MOSFET 67 is controlled by the output of the inverter 57. When the control signal S2 is set at the high level, the analog switch 65 is set in an ON state. When the control signal S2 is set at the low level, the analog switch 65 is set in an OFF state.

A latch circuit 68 includes an inverter 69 and an inverter 70. A node N18 is a connection point between the output of the analog switch 65 and the input of the latch circuit 68. A node N19 is the output of the latch circuit 68, which is a connection point between the output of the inverter 69 and the input of the inverter 70.

An n-channel MOSFET 71 has a source connected to the node N17 (the reference voltage Vref-A), a drain connected to an output terminal of the reference voltage unit 5, and a gate connected to the node N18 (the output of the analog switch 65). The n-channel MOSFET 71 serves as a switch. The ON/OFF state of the n-channel MOSFET 71 is controlled by the voltage at the node N18. The voltage at the output terminal of the reference voltage unit 5 is supplied as the reference voltage Vref.

An n-channel MOSFET 72 has a source connected to the external reference-voltage terminal 56 (and the other end of the resistor 60), a drain connected to the output terminal of the reference voltage unit 5, and a gate connected to the node N19 (the output of the latch circuit 68). The n-channel MOSFET 72 serves as a switch. The ON/OFF state of the n-channel MOSFET 72 is controlled by the voltage at the node N19 (the output of the latch circuit 68).

In the reference voltage unit 5 of FIG. 4, when the external reference-voltage terminal 56 is separated (that is, when the SDRAM is used in the LVTTL system), or when the control signal S2 is set at the high level (that is during the period from the time of power-up of the supply voltage VCC to the time of generation of the signal MRSP), the output of the inverter 57 is set at the low level and the p-channel MOSFET 58 is set in an ON state.

At this time, the voltage (=3.3 volts) at the non-inverting input of the differential amplifier 64 is higher than the voltage (=Vn volts) at the inverting input of the differential amplifier 64, and the output of the differential amplifier 64 is set at the high level. The analog switch 65 is set in an ON state, the voltage at the node N18 is set at the high level, and the n-channel MOSFET 71 is set in an ON state. The high level of the output of the differential amplifier 64 is latched by the latch circuit 68, and the voltage at the node N19 is set at the low level, and the n-channel MOSFET 72 is set in an OFF state.

When the signal MRSP is set at the high level and the control signal S2 is set at the low level, the output of the inverter 57 is set at the high level, the p-channel MOSFET 58 is set in an OFF state, and the differential amplifier 64 is set in the inactive state.

At this time, the analog switch 65 is set in an OFF state. The high level of the voltage at the node N18 and the low level of the voltage at the node N19 are maintained by the latch circuit 68. The n-channel MOSFET 71 is set in an ON state, and the n-channel MOSFET 72 is set in an OFF state.

Accordingly, when the SDRAM is used in the LVTTL system, the reference voltage Vref-A (=1.4 volts) obtained at the node N17 is supplied to the internal unit through the output terminal of the reference voltage unit 5.

Further, in the reference voltage unit 5 of FIG. 4, when the reference voltage Vref-B is supplied to the external reference-voltage terminal 56 (that is, when the SDRAM is used in the SSTL system), or when the control signal S2 is set at the high level (that is, during the period from the time of power-up of the supply voltage VCC to the time of generation of the signal MRSP), the output of the inverter 57 is set at the low level and the p-channel MOSFET 58 is set in an ON state.

At this time, since the resistor 60 has a high resistance, the voltage (=Vref-B) at the non-inverting input of the differential amplifier 64 is lower than the voltage (=Vn) at the inverting input of the differential amplifier 64, and the output of the differential amplifier 64 is set at the low level. The analog switch 65 is set in an ON state, the voltage at the node N18 is set at the low level, and the n-channel MOSFET 71 is set in an OFF state. The low level of the output of the differential amplifier 64 is latched by the latch circuit 68, and the voltage at the node N19 is set at the high level, and the n-channel MOSFET 72 is set in an ON state.

When the signal MRSP is set at the high level and the control signal S2 is set at the low level, the output of the inverter 57 is set at the high level, the p-channel MOSFET 58 is set in an OFF state, and the differential amplifier 64 is set in the inactive state.

At this time, the analog switch 65 is set in an OFF state. The low level of the voltage at the node N18 and the high level of the voltage at the node N19 are maintained by the latch circuit 68. The n-channel MOSFET 71 is set in an OFF state, and the n-channel MOSFET 72 is set in an ON state.

Accordingly, when the SDRAM is used in the SSTL system, the reference voltage Vref-B (=1.4 volts) at the external reference-voltage terminal 56 is supplied to the internal unit through the output terminal of the reference voltage unit 5.

Figure 5:
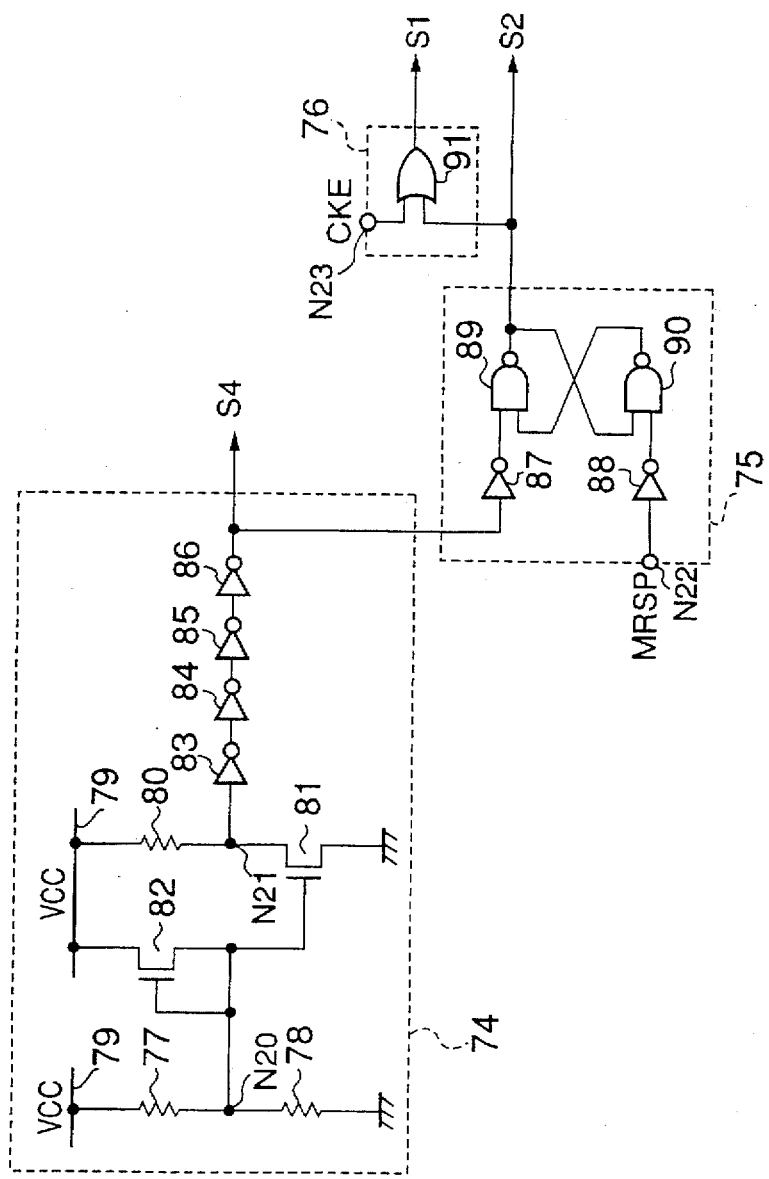
FIG. 5 is a circuit diagram showing a supply voltage rising edge detector, an S1 generator and an S2 generator in a control unit of the SDRAM of FIG. 1.

FIG. 5 partially shows the control unit 6 of the SDRAM of FIG. 1. In FIG. 5, a supply voltage rising edge detector 74, an S2 generator 75, and an S1 generator 76, included in the control unit 6, are shown.

As shown in FIG. 5, the supply voltage rising edge detector 74 produces a control signal S4 indicating the occurrence of the rising edge of the supply voltage VCC. The S1 generator 76 produces the control signal S1 based on the level of the clock enable signal CKE, the level of the signal MRSP and the level of the control signal S4. The S2 generator 75 produces the control signal S2 based on the level of the control signal S4 and the level of the signal MRSP.

In the supply voltage rising edge detector 74 of FIG. 5, two resistors 77 and 78 are connected in series between a VCC power supply line 79 and the grounding line. The VCC power supply line 79 supplies the supply voltage VCC. A node N20 is a connection point between the resistor 77 and the resistor 78. A resistor 80 is connected at one end to the VCC power supply line 79.

An n-channel MOSFET 81 has a source connected to the grounding line, a drain connected to the other end of the resistor 80, and a gate connected to the node N20 (the connection point between the resistors 77 and 78). A node N21 is a connection point between the resistor 80 and the drain of the n-channel MOSFET 81. An n-channel MOSFET 82 has a source connected to the VCC power supply line 79, a drain connected to the node N20, and a gate connected to the node N20.

The resistors 77 and 78 have appropriate resistances such that, after the rising edge of the supply voltage VCC occurs, the voltage at the node N20 which sets the n-channel MOSFET 82 in an ON state can be obtained. When the falling edge of the supply voltage VCC occurs, the n-channel MOSFET 82 quickly falls the voltage at the node N20.

Four inverters 83, 84, 85 and 86 are connected in series between the node N21 and an output terminal of the supply voltage rising edge detector 74. The input of the inverter 83 is connected to the node N21 (the connection point between the resistor 80 and the drain of the n-channel MOSFET 81). The output of the inverter 86 is connected to the output terminal. The supply voltage rising edge detector 74 supplies a detection signal S4 at the output terminal. When the detection signal S4 is set at the high level, the detection signal S4 indicates the occurrence of the rising edge of the supply voltage VCC.

In the S2 generator 75 of FIG. 5, an inverter 87 inverts the detection signal S4 from the supply voltage rising edge detector 74. A node N22 is an input of the S2 generator 75 to which the signal MRSP (mode register set command writing signal) is supplied. An inverter 88 inverts the signal MRSP from the node N22. Two NAND circuits 89 and 90 constitute a flip-flop. A first input of the NAND circuit 89 is connected to the output of the inverter 87, and a second input of the NAND circuit 89 is connected to the output of the NAND circuit 90. A first input of the NAND circuit 90 is connected to the output of the inverter 88, and a second input of the NAND circuit 90 is connected to the output of the NAND circuit 89. The S2 generator 75 has an output terminal connected to the output of the NAND circuit 89, and the S2 generator 75 supplies the control signal S2 at the output of the NAND circuit 89.

In the S1 generator 76 of FIG. 5, a node N23 is an input of the S1 generator 76 to which the clock enable signal CKE is supplied. An OR circuit 91 has a first input connected to the node N23 and a second input connected to the output terminal of the S2 generator 75. The OR circuit 91 performs an OR operation between the control signal S2 from the S2 generator 75 and the clock enable signal CKE from the node N23. The S1 generator 76 has an output terminal connected to the output of the OR circuit 91, and the S1 generator 76 supplies the control signal S1 at the output of the OR circuit 91.

Figure 6:
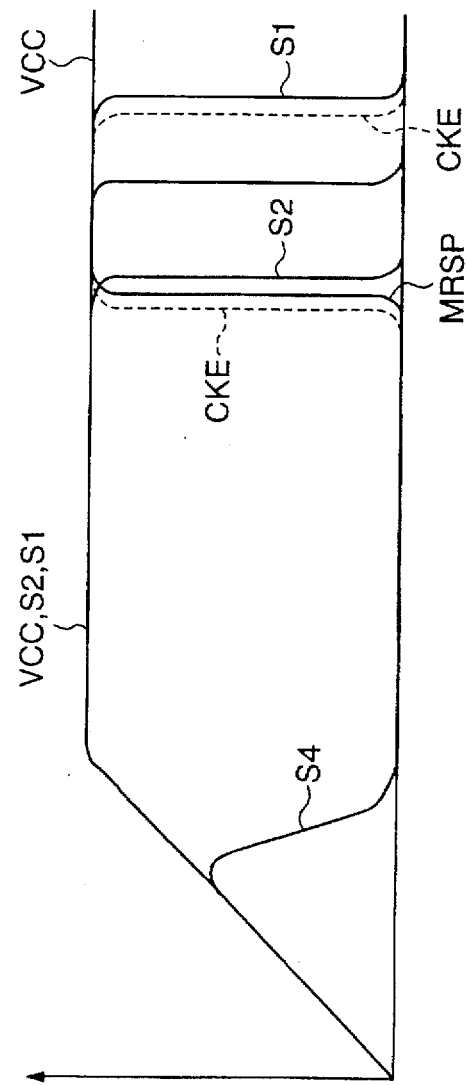
FIG. 6 is a waveform diagram for explaining operations of the supply voltage rising edge detector, the S1 generator and the S2 generator in the control unit of FIG. 5.

FIG. 6 is a waveform diagram for explaining operations of the supply voltage rising edge detector 74, the S2 generator 75 and the S1 generator 76 in the control unit of FIG. 5. In FIG. 6, the supply voltage VCC, the clock enable signal CKE, the detection signal S4, the signal MRSP, the control signal S2 and the control signal S1, when the rising edge of the supply voltage VCC has occurred, are shown.

In the case of FIG. 6, when the rising edge of the supply voltage VCC has occurred, the clock enable signal CKE is set at the low level. When the rising of the supply voltage VCC is started from 0 volts, the voltage at the node N21 increases in accordance with the increase of the supply voltage VCC until the voltage at the node N20 increases to a switch-ON voltage which sets the n-channel MOSFET 81 in an ON state. At this time, the detection signal S4 also increases in accordance with the increase of the supply voltage VCC.

As shown in FIG. 6, after the detection signal S4 is set at the high level, the output of the inverter 87 is set at the low level, the control signal S2 is set at the high level, and the control signal S1 is set at the high level. At this time, the signal MRSP at the node N22 is set at the low level, the output of the inverter 88 is set at the high level, and the output of the NAND circuit 90 is set at the high level.

In the VPR backup unit 2, when the occurrence of the rising edge of the supply voltage VCC is detected, the analog switches 14 and 17 are set in an OFF state, the p-channel MOSFET 20 is set in an ON state, and the n-channel MOSFET 21 is set in an ON state. Thus, the VPR backup unit 2 is set in the active state.

In the reference voltage unit 5, when the occurrence of the rising edge of the supply voltage VCC is detected, the p-channel MOSFET 58 is set in an ON state, the differential amplifier 64 is set in the active state, and the analog switch 65 is set in an ON state.

When the voltage at the node N20 increases to the switch-ON voltage after the occurrence of the rising edge of the supply voltage VCC, the n-channel MOSFET 81 is set in an ON state by the increased voltage at the node N20. The voltage at the node N21 falls to 0 volts, and the detection signal S4 falls to 0 volts.

After the detection signal S4 is set at the low level (0 volts), the output of the inverter 87 is set at the high level but the output of the NAND circuit 90 is set at the low level. The control signal S2 remains at the high level and the control signal S1 remains at the high level.

After this, when the signal MRSP is set at the high level, the output of the inverter 88 is set at the low level and the output of the NAND circuit 90 is set at the high level. At this time, the output of the inverter 87 is set at the high level. The control signal S2 is set at the low level.

The clock enable signal CKE is set at the high level when the signal MRSP being set at the high level is supplied to the node N22. At this time, the control signal S1 remains at the high level although the control signal S2 is set at the low level.

Further, when the signal MRSP is set at the low level, the output of the inverter 88 is set at the high level but the control signal S2 is set at the low level. The output of the NAND circuit 90 remains at the high level, and the control signal S2 remains at the low level.

Further, when the clock enable signal CKE is set at the low level, the control signal S1 is set at the low level as shown in FIG. 6. At this time, the VPR backup unit 2 is set in the inactive state. In the reference voltage unit 5, the p-channel MOSFET 58 is set in an OFF state, and the differential amplifier 64 is set in the inactive state.

Further, when the clock enable signal CKE is set at the high level and the word line is powered up (that is, when the control signal S1 is set at the high level and the signal "rasz" is set at the high level), the VDP backup unit 4 is set in the active state. This is not shown in FIG. 6. At this time, in the VDP backup unit 4, the analog switch 39 is set in an OFF state, the p-channel MOSFET 42 is set in an ON state, and the n-channel MOSFET 43 is set in an ON state.

Figure 7:
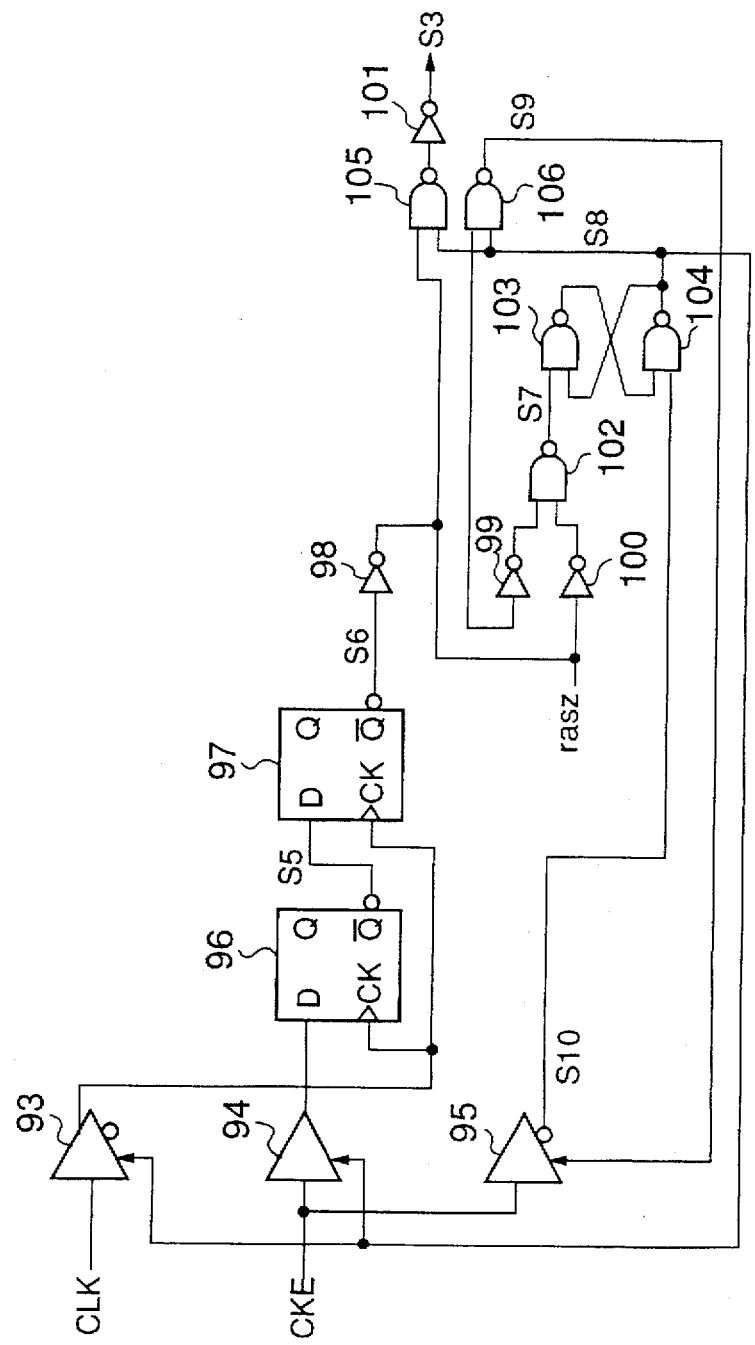
FIG. 7 is a circuit diagram showing an S3 generator in the control unit of the SDRAM of FIG. 1.

FIG. 7 shows an S3 generator included in the control unit 6 of the SDRAM of FIG. 1. In FIG. 7, the S3 generator supplies a control signal S3 at an output terminal thereof, and the control signal S3 is sent to the VDP backup unit 4.

As shown in FIG. 7, a clock buffer 93 inputs the external clock signal CLK. Two buffers 94 and 95 input the clock enable signal CKE. A D-flip-flop 96 and a D-flip-flop 97 are connected in series as shown in FIG. 7. Four inverters 98, 99, 100 and 101 and five NAND circuits 102, 103, 104, 105 and 106 are connected as shown in FIG. 7.

Figure 8:
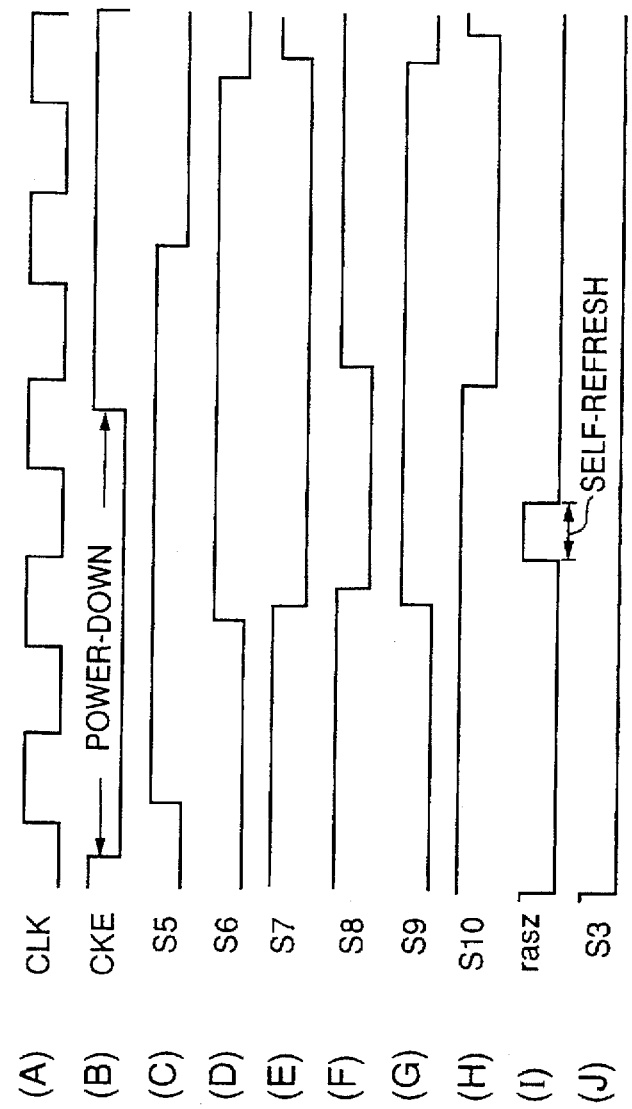
FIG. 8 is a time chart for explaining a power-down/self-refresh mode of the S3 generator of FIG. 7.
Figure 9:
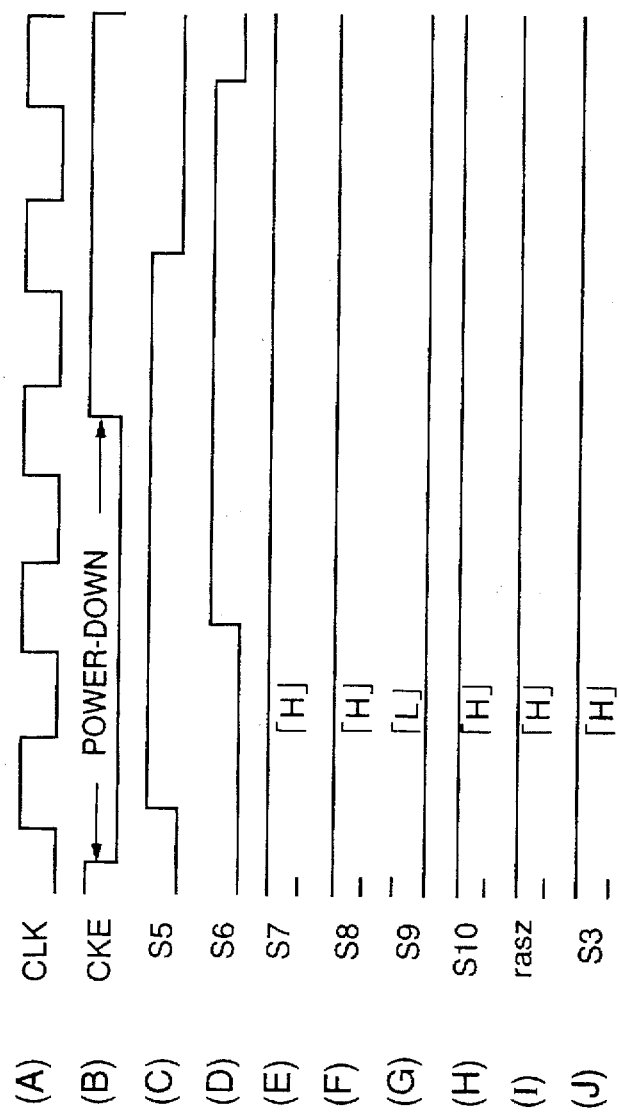
FIG. 9 is a time chart for explaining a clock-suspend mode of the S3 generator of FIG. 7.

FIG. 8 is a time chart for explaining a power-down/self-refresh mode of the S3 generator of FIG. 7. FIG. 9 is a time chart for explaining a clock-suspend mode of the S3 generator of FIG. 7.

In FIGS. 8 and 9, (A) indicates a change of the clock signal CLK at the input of the clock buffer 93 of the S3 generator of FIG. 7, (B) indicates a change of the clock enable signal CKE at the inputs of the buffers 94 and 95, (C) indicates a change of a signal S5 at the output of the D-flip-flop 96, (D) indicates a change of a signal S6 at the output of the D-flip-flop 97, and (E) indicates a change of a signal S7 at the output of the NAND circuit 102.

Further, in FIGS. 8 and 9, (F) indicates a change of a signal S8 at the output of the NAND circuit 104 of the S3 generator of FIG. 7, (G) indicates a change of a signal S9 at the output of the NAND circuit 106, (H) indicates a change of a signal S10 at the output of the buffer 95, (I) indicates a change of the signal "rasz" at the input of the inverter 100, and (J) indicates a change of the control signal S3 at the output of the inverter 101.

As shown in FIG. 8, in the power-down/self-refresh mode of the S3 generator of FIG. 7, during the power-down of the SDRAM, the clock enable signal CKE is set at the low level. When a self-refresh action of the SDRAM is performed during the power-down, the rising edge and the falling edge of the signal "rasz" occur. The control signal S3 is always set at the low level ("L").

As shown in FIG. 9, in the clock-suspend mode of the S3 generator of FIG. 7, during the power-down of the SDRAM, the control signal S3 is always set at the high level ("H").

In the semiconductor apparatus of the above-described embodiment, the VPR backup unit 2, which is provided in association with the VPR voltage unit 1, is set in the active state by the control unit 6 during a period for which a load exceeds a capability of charging and discharging of the VPR voltage unit 1 (that is, during the period from the time of power-up of the supply voltage VCC to the time of generation of the signal MRSP or when the clock enable signal CKE is set at the high level). The VPR backup unit 2 is set in the inactive state by the control unit 6 when the load does not exceed the capability of charging and discharging of the VPR voltage unit 1 (that is, when the clock enable signal CKE is set at the low level). Therefore, the VPR backup unit 2 of the above-described embodiment can efficiently consume power.

Further, in the semiconductor apparatus of the above-described embodiment, the VDP backup unit 4, which is provided in association with the VDP voltage unit 3, is set in the active state by the control unit 6 when the load is above a capability of charging and discharging of the VDP voltage unit 3 (that is: during the period from the time of power-up of the supply voltage VCC to the time of generation of the signal MRSP; when the clock enable signal CKE is set at the high level and the word line is powered up; or when the control unit 6 is in the clock-suspend mode). The VDP backup unit 4 is set in the inactive state by the control unit 6 when the load does not exceed the capability of charging and discharging of the VDP voltage unit 3. Therefore, the VDP backup unit 4 of the above-described embodiment can efficiently consume power.

Further, in the semiconductor apparatus of the above-described embodiment, the reference voltage unit 5 is provided to supply the internally produced reference voltage Vref-A to the internal unit through the output terminal of the reference voltage unit 5 when the reference voltage Vref-B is not supplied to the reference-voltage terminal 56, and supply the reference voltage Vref-B to the internal unit through the output terminal when the reference voltage Vref-B is supplied to the reference-voltage terminal 56. In the semiconductor apparatus of the above-described embodiment, the p-channel MOSFET 58 is set in an ON state and the differential amplifier 64 is set in the active state only during the period from the time of power-up of the supply voltage VCC to the time of generation of the signal MRSP. Otherwise the p-channel MOSFET 58 is set in an OFF state and the differential amplifier 64 is set in the inactive state. Therefore, the reference voltage unit 5 of the above-described embodiment can efficiently consume power.

Therefore, according to the semiconductor apparatus of the above-described embodiment, it is possible to provide a reduction of the power consumption.

Figure 10:
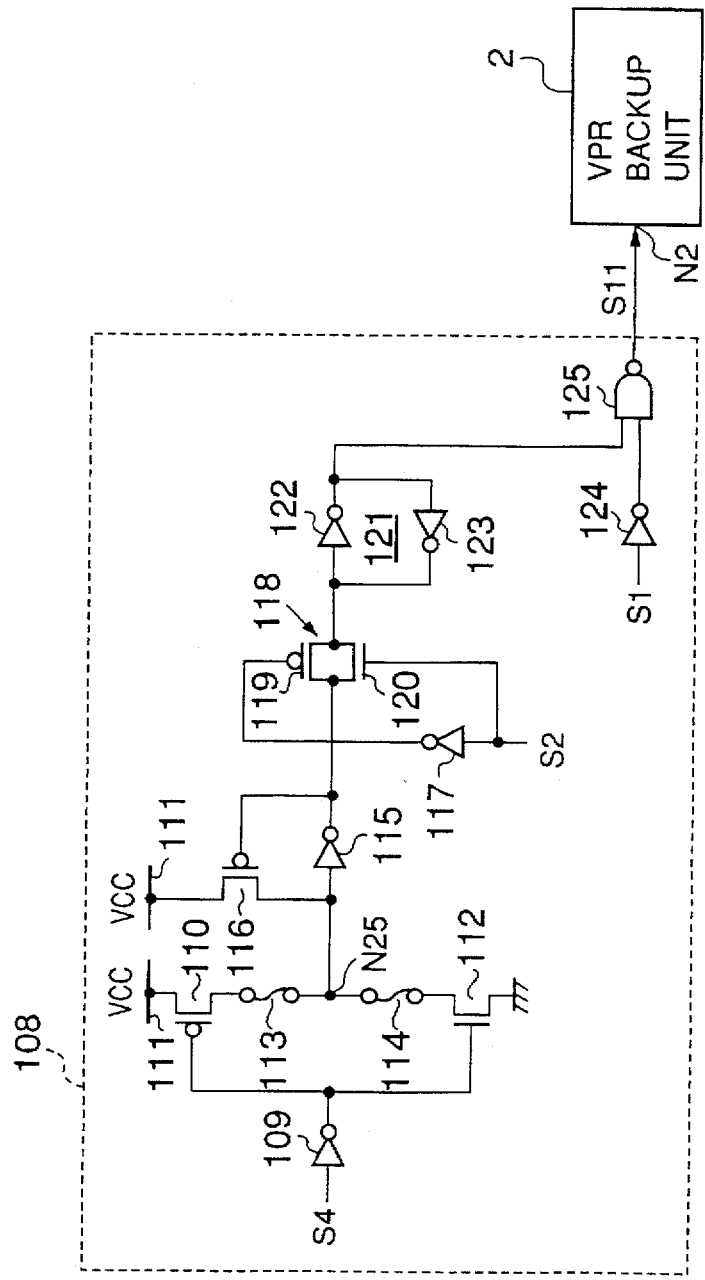
FIG. 10 is a circuit diagram showing another control unit of the SDRAM of FIG. 1.

FIG. 10 partially shows another control unit of the SDRAM of FIG. 1. In FIG. 10, a backup control unit 108 supplies a control signal S11 to the node N2 of the VPR backup unit 2, instead of the S1 generator 76 of the control unit 6 of FIG. 5 which supplies the control signal S1 to the node N2 of the VPR backup unit 2. Other elements are the same as corresponding elements of the SDRAM of FIGS. 2, 5, and 7, and a description thereof will be omitted.

The backup control unit 108 of FIG. 10 sets the VPR backup unit 2 in the active state when a defect in the VPR voltage unit 1 occurs and a leak current in the VPR voltage unit 1 exceeds the current supplied by the VPR voltage unit 1, so that the voltage VPR at the node N1 of the VPR voltage unit 1 is maintained to be in the range of voltages of VCC/2±α (volts).

As shown in FIG. 10, an inverter 109 inverts the detection signal S4 supplied by the supply voltage rising edge detector 74 of FIG. 5. A p-channel MOSFET 110 has a source connected to a VCC power supply line 111, and a gate connected to the output of the inverter 109. An n-channel MOSFET 112 has a source connected to the grounding line, and a gate connected to the output of the inverter 109.

A fuse 113 is connected at one end to a drain of the p-channel MOSFET 110. A fuse 114 is connected at one end to the other end of the fuse 113 and connected at the other end to a drain of the n-channel MOSFET 112. The fuse 113 is intended to open at overload. The fuse 114 is provided to balance with the fuse 113, and the fuse 114 is not intended to open at overload. A node N25 is a connection point between the fuse 113 and the fuse 114.

An inverter 115 inverts the signal at the node N25. A p-channel MOSFET 116 has a source connected to the VCC power supply line 111, a drain connected to the node N25, and a gate connected to the output of the inverter 115.

An inverter 117 inverts the control signal S2 supplied by the S2 generator 75 of FIG. 5. An analog switch 118 includes a p-channel MOSFET 119 and an n-channel MOSFET 120 which are connected to each other as shown in FIG. 10. The p-channel MOSFET 119 has a gate connected to the output of the inverter 117, and the ON/OFF state of the p-channel MOSFET 119 is controlled by the output of the inverter 117. The n-channel MOSFET 120 has a gate connected to the node of the control signal S2, and the ON/OFF state of the n-channel MOSFET 120 is controlled by the control signal S2.

A latch circuit 121 includes an inverter 122 and an inverter 123 which are connected to each other as shown in FIG. 10.

An inverter 124 inverts the control signal S1 supplied by the S1 generator 76 of FIG. 5. A NAND circuit 125 has a first input connected to the output of the latch circuit 121 and a second input connected to the output of the inverter 124. The NAND circuit 125 performs a NAND operation between the output of the latch circuit 121 and the output of the inverter 124, and outputs the control signal S11 to the node N2 of the VPR backup unit 2.

In the backup control unit 108 of FIG. 10, the fuse 113 does not open when a process defect is produced in a SDRAM chip and a leak current on the load of the VPR voltage unit 1 does not occur, or when a process defect is produced in the SDRAM chip and a leak current on the load of the VPR voltage unit 1 does not exceed the current supplied by the VPR voltage unit 1.

In this case, when the supply voltage VCC is powered up and the detection signal S4 is set at the high level, the output of the inverter 109 is set at the low level, the p-channel MOSFET 110 is set in the ON state, and the n-channel MOSFET 112 is set in the OFF state. The control signal S2 is set at the high level, and the analog switch 118 is set in the ON state.

At this time, the fuse 113 does not open and the signal at the node N25 is set at the high level. The output of the inverter 115 is set at the low level, and the low level of the output of the inverter 115 is latched by the latch circuit 121 through the analog switch 118. The output of the latch circuit 121 is set at the high level.

After this, when the signal MRSP is set at the high level, the control signal S2 is set at the low level, and the analog switch 118 is set in the OFF state. The output of the latch circuit 121 remains at the high level.

In the above case, the NAND circuit 125 serves as the inverter for the output of the inverter 124. Only when the control signal S1 is set at the high level, the control signal S11 is set at the high level. Otherwise the control signal S11 is set at the low level. The VPR backup unit 2 operates in the same manner as described above in conjunction with FIG. 2.

On the other hand, in the backup control unit 108 of FIG. 10, the fuse 113 opens or fused out when a process defect in the SDRAM chip is produced and the leak current on the load of the VPR voltage unit 1 exceeds the current supplied by the VPR voltage unit 1.

In this case, when the supply voltage VCC is powered up and the detection signal S4 is set at the high level, the output of the inverter 109 is set at the low level, the p-channel MOSFET 110 is set in the ON state, and the n-channel MOSFET 112 is set in the OFF state. The control signal S2 is set at the high level, and the analog switch 118 is set in the ON state.

After this, when the falling edge of the detection signal S4 occurs, the output of the inverter 109 is set at the high level. The p-channel MOSFET 110 is set in the OFF state, and the n-channel MOSFET 112 is set in the ON state.

The signal at the node N25 is set at the low level. The output of the inverter 115 is set at the high level, and the high level of the output of the inverter 115 is latched by the latch circuit 121 through the analog switch 118. The output of the latch circuit 121 is set at the low level.

After this, when the signal MRSP is set at the high level, the control signal S2 is set at the low level, and the analog switch 118 is set in the OFF state. The output of the latch circuit 121 remains at the low level.

In the above case, the control signal S1 is set at the high level, regardless of the level of the control signal S1. The VPR backup unit 2 is always set in the active state and supplements the leak current on the load of the VPR voltage unit 1, and controls the VPR voltage unit 1 so that the voltage VPR at the node N1 is maintained to be in the range of voltages of VCC/2±α (volts).

In the semiconductor apparatus of the above-described embodiment, the features which are the same as the features of the control unit of FIGS. 5 and 7 are achieved by the backup control unit 108 of FIG. 10, and further, it is possible to always set the VPR backup unit 2 in the active state when the process defect is produced in the SDRAM chip and the leak current on the load of the VPR voltage unit 1 exceeds the current supplied by the VPR voltage unit 1, so that the voltage VPR at the node N1 is maintained to be in the range of voltages of VCC/2±α (volts). Even if the SDRAM chip has the leak current on the load of the voltage unit exceeding the current supplied by the voltage unit, the semiconductor apparatus of the above-described embodiment ensures the operation of the SDRAM with a reduced power consumption and it is not necessary to remove the chip from the SDRAM products as a defective item. Therefore, according to the semiconductor apparatus of the above-described embodiment, it is possible to provide an enhancement of SDRAM chip yields.

Further, the present invention is not limited to the above-described embodiments, and variations and modifications may be made without departing from the scope of the present invention.

What is claimed is:

1. A semiconductor apparatus comprising:
   a voltage unit for supplying a down voltage produced at a node, said voltage unit having a plurality of resistors connected in series between a power supply line and a grounding line, said node being a connection point between the resistors;
   a backup unit for pulling up the node of the voltage unit when a voltage at the node is below a lower limit of the down voltage, so that the voltage at the node increases to the lower limit, and for pulling down the node of the voltage unit when the voltage at the node is above an upper limit of the down voltage, so that the voltage at the node decreases to the upper limit; and
   a control unit for setting the backup unit in one of an active state and an inactive state in response to a control signal.

2. The semiconductor apparatus according to claim 1, wherein said backup unit comprises:
   a first n-channel MOSFET having a gate, a source connected to the node of the voltage unit, and a drain connected to the power supply line, said first n-channel MOSFET having a threshold voltage;
   a first p-channel MOSFET having a gate, a source connected to the node of the voltage unit, and a drain connected to the grounding line, said first p-channel MOSFET having a threshold voltage; and
   a pull-up/pull-down control unit for supplying a sum of the lower limit of the down voltage and the threshold voltage of the first n-channel MOSFET to the gate of the first n-channel MOSFET and supplying a difference between the upper limit of the down voltage and an absolute value of the threshold voltage of the first p-channel MOSFET to the gate of the first p-channel MOSFET when the control signal is set at a first level, and for supplying the voltage at the node to both the gate of the first n-channel MOSFET and the gate of the first p-channel MOSFET when the control signal is set at a second level.

3. The semiconductor apparatus according to claim 2, wherein said pull-up/pull-down control unit comprises:
   a first switch having a first end connected to the power supply line and a second end, said first switch being set in an ON state when the control signal is set at the first level, and being set in an OFF state when the control signal is set at the second level;
   a second switch having a first end connected to the grounding line and a second end, said second switch being set in an ON state when the control signal is set at the first level, and being set in an OFF state when the control signal is set at the second level;
   a first resistor, a second resistor and a third resistor, connected in series between the second end of the first switch and the second end of the second switch;
   a fourth resistor having a first end connected to the second end of the first switch and a second end connected to the gate of the first n-channel MOSFET;
   a second n-channel MOSFET having a source connected to a connection point between the second resistor and the third resistor, a drain and a gate both connected to the gate of the first n-channel MOSFET;
   a second p-channel MOSFET having a source connected to a connection point between the first resistor and the second resistor, a drain and a gate both connected to the gate of the first p-channel MOSFET; and
   a fifth resistor having a first end connected to the gate of the first p-channel MOSFET and a second end connected to the second end of the second switch.

4. The semiconductor apparatus according to claim 3, wherein said apparatus is a synchronous dynamic random access memory, said down voltage is half as much as a supply voltage from the power supply line and is supplied to pre-charge a bit line for outputting data of a cell, and the control signal is set at the first level during a period from a time of power-up of the supply voltage to a time of generation of a mode register set command writing signal, and when a clock enable signal is set at a high level.

5. The semiconductor apparatus according to claim 4, wherein said control unit comprises a backup control unit for outputting the control signal to the backup unit, said control signal being selectively set, after completion of the power-up of the supply voltage, at one of the first level and the second level depending on a leak current occurrence in the voltage unit exceeding a current supplied by the voltage unit.

6. The semiconductor apparatus according to claim 1, wherein said backup unit comprises:
  a first switch having first and second n-channel MOSFETs connected in series between the power supply line and the node of the voltage unit, said first n-channel MOSFET having a drain connected to the power supply line, said second n-channel MOSFET having a source connected to the node of the voltage unit, said first switch being set in an ON state when the control signal is set at a first level, and being set in an OFF state when the control signal is set at a second level;
  a second switch having third and fourth n-channel MOSFETs connected in series between the grounding line and the node of the voltage unit, said third n-channel MOSFET having a source connected to the grounding line, said fourth n-channel MOSFET having a drain connected to the node of the voltage unit, said second switch being set in an ON state when the control signal is set at the first level, and being set in an OFF state when the control signal is set at the second level; and
  a pull-up/pull-down control unit for supplying a first voltage to a gate of the first n-channel MOSFET and supplying a second voltage to a gate of the third n-channel MOSFET when the voltage at the node of the voltage unit is lower than a lower limit of the down voltage when the control signal is set at the first level, so that the first n-channel MOSFET is set in an ON state and the third n-channel MOSFET is set in an OFF state, and said pull-up/pull-down control unit supplying a third voltage to the gate of the first n-channel MOSFET and supplying a fourth voltage to the gate of the third n-channel MOSFET when the voltage at the node of the voltage unit is higher than an upper limit of the down voltage during a period, so that the first n-channel MOSFET is set in an OFF state and the third n-channel MOSFET is set in an ON state.

7. The semiconductor apparatus according to claim 6, wherein said pull-up/pull-down control unit comprises:
  a third switch having a first end connected to the power supply line and a second end, said third switch being set in an ON state when the control signal is set at the first level, and being set in an OFF state when the control signal is set at the second level;
  a fourth switch having a first end connected to the grounding line and a second end, said fourth switch being set in an ON state when the control signal is set at the first level, and being set in an OFF state when the control signal is set at the second level;
  a first resistor, a second resistor, a third resistor and a fourth resistor, connected in series between the second end of the third switch and the second end of the fourth switch;
  a first differential amplifier having a non-inverting input connected to a connection point between the third resistor and the fourth resistor, an inverting input connected to the node of the voltage unit, and an output connected to the gate of the first n-channel MOSFET, said first differential amplifier being set in an active state when the control signal is set at the first level, and being set in an inactive state when the control signal is set at the second level;
  a second differential amplifier having a non-inverting input connected to the node of the voltage unit, an inverting input connected to a connection point between the first resistor and the second resistor, and an output connected to the gate of the third n-channel MOSFET, said second differential amplifier being set in an active state when the control signal is set at the first level, and being set in an inactive state when the control signal is set at the second level.

8. The semiconductor apparatus according to claim 7, wherein said apparatus is a synchronous dynamic random access memory, said down voltage is lower than half a supply voltage from the power supply line and supplied to pre-charge a data bus connected to an output buffer for outputting data to an external terminal, and said control signal is set at the first level during a period from a time of power-up of the supply voltage to a time of generation of a mode register set command writing signal, when a clock enable signal is set at a high level and a word line is powered up, and when the control unit is in a clock-suspend mode.

9. A semiconductor apparatus comprising:
  a voltage unit for supplying a down voltage produced at a node, said voltage unit having a plurality of resistors connected in series between a power supply line and a grounding line, said node being a connection point between the resistors;
  a backup unit for pulling up the node of the voltage unit when a voltage at the node is below a lower limit of the down voltage, so that the voltage at the node increases to the lower limit, and for pulling down the node of the voltage unit when the voltage at the node is above an upper limit of the down voltage, so that the voltage at the node decreases to the upper limit;
  a control unit for setting the backup unit in one of an active state and an inactive state in response to a control signal;
  a reference voltage unit; and
  an external terminal which is separated from the reference voltage unit when the apparatus is operable in a first data transmission system, and a first reference voltage being supplied to said external terminal when the apparatus is operable in a second data transmission system,
  said reference voltage unit comprising:
    a reference voltage generating unit for supplying a second reference voltage produced at a first node from a supply voltage, the second reference voltage being equal to the first reference voltage, said reference voltage generating unit having a plurality of resistors connected in series between the power supply line and the grounding line, said first node being a connection point between the resistors;
    a series circuit having a switch and a resistor connected in series between the power supply line and the external terminal, said switch being set in an ON state during a period from a time of power-up of the supply voltage to a time of generation of a mode register set command writing signal, and being set in an OFF state after the end of the period;

a differential amplifier having an output, a non-inverting input connected to the external terminal and an end of the series circuit, and an inverting input connected to a second node between the power supply line and an external line, said second node supplying an intermediate voltage which is higher than the second reference voltage and lower than the supply voltage, said differential amplifier being set in an active state during said period and being set in an inactive state after the end of said period; and a reference voltage control unit for supplying the second reference voltage from the first node to an internal unit when the output of the differential amplifier is set at a high level, and for supplying the first reference voltage from the external terminal to the internal unit when the output of the differential amplifier is set at a low level.

10. The semiconductor apparatus according to claim 9, wherein said semiconductor apparatus is a synchronous dynamic random access memory, said first data transmission system is a low voltage transistor transistor logic system, said second data transmission system is a stub series terminated transceiver logic system, and the control signal is set at a first level during a period from a time of power-up of the supply voltage to a time of generation of a mode register set command writing signal, said mode register set command writing signal being generated to write a mode register set command to a mode register.

* * * * *